United States Patent [19]

Deatcher et al.

[11] Patent Number: 5,089,303
[45] Date of Patent: Feb. 18, 1992

[54] BLEND OF SOLVENT AND PHOTOCURABLE ARYLSILOXANE MATERIALS

[75] Inventors: John H. Deatcher, Lake Peekskill; Eric W. Burkhardt, Brewster, both of N.Y.

[73] Assignee: Akzo America Inc., Dobbs Ferry, N.Y.

[21] Appl. No.: 342,150

[22] Filed: Apr. 24, 1989

[51] Int. Cl.⁵ .............................................. C08K 5/06
[52] U.S. Cl. .................................. 427/387; 524/376; 524/377; 524/588
[58] Field of Search ...................... 524/376, 377, 588; 428/429; 522/79, 148; 528/30; 427/387

[56] References Cited

U.S. PATENT DOCUMENTS

| | | | |
|---|---|---|---|
| 4,349,609 | 9/1982 | Takeda et al. | 428/429 |
| 4,507,384 | 3/1985 | Morita et al. | 522/148 |
| 4,510,283 | 4/1985 | Takeda et al. | 524/376 |
| 4,600,685 | 7/1986 | Kitakohji et al. | 430/313 |
| 4,622,261 | 11/1986 | Ochiai | 428/429 |
| 4,663,414 | 5/1987 | Estes et al. | 528/30 |
| 4,758,620 | 7/1988 | Whitwell et al. | 524/474 |
| 4,772,408 | 9/1988 | Mohr et al. | 528/30 |
| 4,801,507 | 1/1989 | Estes et al. | 528/39 |
| 4,816,541 | 3/1989 | Koerner et al. | 522/148 |
| 4,842,986 | 6/1989 | Matsuda et al. | 522/148 |
| 4,904,721 | 2/1990 | Hanaoka et al. | 524/377 |

FOREIGN PATENT DOCUMENTS 0068671 1/1983 European Pat. Off. .
1312576 4/1973 United Kingdom .

OTHER PUBLICATIONS

CA 102:103612e.
CA 99:22415x.

Primary Examiner—Veronica P. Hoke
Attorney, Agent, or Firm—Richard P. Fennelly; Louis A. Morris

[57] ABSTRACT

Good quality films can be formed on a substrate by coating a substrate with a solution comprising an alkoxy alkanol solvent containing a dissolved photocurable arylsiloxane oligomer or polymer. Phenyl siloxane/silicate compositions can be used to form photocurable films on substrates for use as dielectric films, protective coatings, and the like.

9 Claims, No Drawings

BLEND OF SOLVENT AND PHOTOCURABLE ARYLSILOXANE MATERIALS

BACKGROUND OF THE PRESENT INVENTION

The present invention is directed to an improved mixture of a particular class of solvent and a photocurable arylsiloxane material which can be used, for example, to form striation-free films having good reflectivity characteristics.

DESCRIPTION OF THE PRIOR ART

Photocurable arylsiloxane materials, suitable for use as interlayer dielectric films, which can be spin coated are known to persons of ordinary skill in the art. For example, U.S. Pat. No. 4,349,609 to S. Takeda et al. mentions the use of a variety of solvents, including a mixture of cyclohexanone and toluene, a mixture of n-butyl cellosolve acetate and toluene, a mixture of isophorone and toluene, metacresol, and a mixture of N-methyl-2 pyrrolidone and N,N-dimethylacetamide. Various of these enumerated solvents are either corrosive, are teratogenic, are carcinogenic, or are irritants. More recent U.S. Pat. No. 4,600,685 to T. Kitakohji et al. also indicates the spin-coating of organosiloxane resins to form interlayer dielectric films. This reference mentions such solvents as toluene, cyclohexane, methyl cellosolve acetate (a suspected teratogen), alcohols, and ketones. Example 4 illustrates a mixed solvent of monobutylcellosolve acetate and toluene. This reference fails to ascribe any superiority to selection of any particular solvent used.

Another example of a recent U.S. patent which describes the spin-coating of arylsiloxane oligomers and polymers to form interlayer dielectric films is U.S. Pat. No. 4,663,414 to W. E. Estes et al. which indicates the use of xylene as a preferred aromatic hydrocarbon as the solvent. This patent indicates that toluene and benzyl alcohol are less preferred solvents for use in the spin-coating procedure.

Certain disclosures exist which mention the use of alkoxy alkanol solvents in systems which differ significantly from those of the instant invention. European Patent Publication No. 68,671 shows a system comprising an alkyl or alkoxyalkyl group-containing siloxane polymer which would not be photocurable. The compositions described in this patent publication are intended for the water repellent treatment of a variety of substrates. British Patent No. 1,312,576, on the other hand, describes a heterogeneous system containing substantial amounts of filler which is to be used as a flame-retardant coating for porous materials.

SUMMARY OF THE PRESENT INVENTION

The present invention relates to the discovery that arylsiloxane oligomers or polymers can be dissolved in an alkoxy alkanol to yield a clear, photocurable solution which, when used in a coating procedure, e.g., a spin-coating procedure, gives striation-free photocurable films of superior thickness, for example to those shown in U.S. Pat. No. 4,758,620, that do not have reduced reflectivity.

DETAILED DESCRIPTION OF THE PRESENT INVENTION

As will be appreciated by a person of ordinary skill in the art, it is desired that films spin coated from a solvent medium be substantially free of a rippled (or striated) surface, have no substantial reduction in their reflectivity, and also be generated from substantially clear solutions. The reasons for such requirements in the case of interlayer dielectric films are improved coverage of underlying features, a substantially planar surface for deposition of subsequent interconnect layers, and improved behavior in photolithographic imaging and processing. These are all necessary for the production of high density VLSICs.

In accordance with the present invention, photo-curable arylsiloxane oligomers and polymers can be dissolved in a particular class of solvent to yield the desired clear solutions which can result in the production of substantially non-striated films that do not have any substantial reduction in their reflectivity when the solutions are used in a spin-coating procedure to form interlayer dielectric films. Representative types of arylsiloxane polymers that can be dissolved in the solvent described in connection with the present invention are wellknown to persons of ordinary skill in the art and include the types of organosiloxane resins described in U.S. Pat. Nos. 4,349,609 and 4,600,685, referred to above, each of which is incorporated herein by reference.

More recent U.S. Pat. No. 4,663,414 to W. E. Estes, which is also incorporated herein by reference, describes another type of organosiloxane material which yields phospho-boro-silanol interlayer dielectric films and which can be used in a spin-coating procedure.

Yet another type of organosiloxane oligomer or polymeric composition which can be used in conjunction with the present invention is described in U.S. Pat. No. 4,801,507, entitled "Arylsiloxane/Silicate Compositions Useful as Interlayer Dielectric Films", which is incorporated herein by reference. The latter type of siloxane/silicate compositions are formed by the cohydrolyzation and cocondensation of an aryl group-containing trifunctional silanetriol, or derivative thereof, with a tetrafunctional silicic acid compound. For example, cohydrolyzed/condensed materials formed by the reaction of phenyl silanetriol and a tetraalkyl silicate, such as, tetraethyl silicate, are preferred materials in accordance with the above-mentioned patent.

The use of the alkoxy alcohols in the formation of the phenyl siloxane/silicate compositions of U.S. Pat. No. 4,801,507 has been found to achieve the desired synthesis without the need for either condensation catalyst or water for the hydrolysis step. This is surprising since tetraethyl silicate, when placed in the presence of other alcohols and without the added presence of the phenyl siloxane material, which contains free -OH groups, does not hydrolyze and condense. In regard to the use of the alkoxy alcohol solvents described herein it has been found that these phenyl siloxane/silicate compositions can be spin coated very soon after they are formed and have a good shelf life after being allowed to stand over time. In contrast, even if the alkoxy alcohols are used with the phenyl siloxane material above, some degree of standing of the thus formed solution is normally needed in order for good quality films to be formed.

In accordance with the present invention, and as described in greater detail in the Examples which follow, the use of an alkoxy alkanol as a solvent for the aforementioned type of arylsiloxane oligomers or polymers results in the production of striation-free films of superior thickness having no substantial reduction in reflectivity when a spin-coating procedure is performed to form, for example, a thin interlayer dielectric film on a suitable semiconductor wafer. Such is not the case with other solvents, as is shown in certain of the Examples which follow. The alkoxy alkanols of the present invention may have the formula R'OROH with R' being $C_1-C_4$ alkyl and R being $C_2-C_3$ alkylene. Methoxypropanol (e.g., 1-methoxy-2-propanol) is preferred.

It is within the contemplation of the instant invention to form photocurable compositions which comprise an arylsiloxane component at from about 5% to about 40%, by weight of the entire composition, and the alkoxy alcohol solvent from about 60% to about 95%, by weight. When the arylsiloxane/silicate materials of U.S. Pat. No. 4,801,507 are used (which is preferred) the weight ratio of aryl group-containing trifunctional silanetriol (or derivative used in forming such materials) will range from about 10:1 to about 3:1 based on the weight of tetrafunctional silicic acid compound (tetraalkyl silicate). Especially preferred is a 68% weight amount of alkoxy alcohol, 32% siloxane/silicate material (a 6:1 reaction product of silanol functional phenyl silicone resin (Wacker Silicone Intermediate SY430 brand) with tetraethyl silicate or triethoxyvinylsilane).

The aryl siloxane/silicate materials of U.S. Pat. No. 4,801,507 are capable of being developed in either a positive or negative way when photomasked, photolyzed, and then appropriately treated. For example, the photolyzed portion is not soluble in most common organic solvents (e.g., acetone, isopropanol, etc.) allowing for such solvents to wash away the masked portions to produce a negative image. If a positive image is desired, hydrogen fluoride can be used to treat the photolyzed portion leaving the masked portions intact.

Another embodiment of the present invention involves more than the deposit of non-conductive, dielectric films in electronic devices. It involves the coating of a desired substrate with a protective film having certain desirable properties.

One embodiment of the instant invention involves the placement of a protective coating on an optical glass substrate (e.g., the placement of such a protective coating on eyeglass lenses to prevent their scratching when used). Such a coating can be photocured (due to the presence of a photocurable phenyl siloxane moiety) at relatively low temperature with no attendant heat curing and distortion of the shape of the underlying lens material. The coating will be hard enough to have scratch resistance but be organic (phenyl-group containing) enough in character to be photocurable. The system is compatible with such organic dyes as Irgalite Blue LGLD and Irgazin Yellow 3 RLT thereby allowing for the production of films on optical substrates which are tinted.

Other substrates can also be coated with the instant compositions to achieve placement of protective coatings therein. Examples of such substrates include silicon wafers, aluminum oxide wafers, glass, polyimides, polyether ether ketone, carbon composites, graphite composites, and the like. For example, microcircuits can be hermetically sealed with the cured composition. Silicon wafers which were spin coated with the instant compositions show no moisture uptake, for example, when exposed to 81% relative humidity for a period of two weeks at room temperature. Certain kinds of glasses which are sensitive to moisture and other forms of environmental degradation can also be coated with the compositions which would be photocured.

The photocurable compositions of the instant invention can be applied to a desired substrate by various means (e.g., spin coating, dip coating, spray coating, etc.). The preferred alkoxy alcohols are those that are propylene glycol-derived since they are neither corrosive, tetratogenic, carcinogenic, or an irritant. This allows for their use in large quantity (e.g., for spray and/or dip coating) to coat large, irregularly shaped objects. The solvent 3-methoxy-2-propanol is an especially preferred solvent since it has good solvating properties and cures well. Use of ethylene glycol-derived alkoxy alcohols as solvents may necessitate dilution in order to achieve good film properties aside from possible environmental concerns regarding their use.

The Example which follows sets forth certain results that were obtained when various solvents were used in a spin-coating procedure using the arylsiloxane/silicate compositions of the co-pending application.

EXAMPLE 1

The interlayer dielectric (ILD) formulation that was spin coated in the Examples which follow is described in U.S. Pat. No. 4,801,507, entitled "Arylsiloxane/Silicate Compositions Useful as Interlayer Dielectric Films". It comprised 74% silanol functional phenyl silicone resin (WACKER SY430 brand), and 26% ethyl silicate. In this Example, the spin-coating was performed using a variety of differing solvents.

The foregoing ILD formulation was used in a generally conventional spin-coating process to form a thin film on each of a large number of essentially flat, circular, single crystal, silicon wafers having diameters ranging 2 to 4 inches. The spin-coating machine was Model No. EC-102-NRD supplied by Headway Research The spin-coating process was carried out in a laminar flow hood with particulate filtration to 0.3 microns. The films were generated by applying about 3-3.5 grams of the formulation to a four-inch diameter wafer so as to cover about one-half of its surface area. Each wafer was then accelerated to a desired angular velocity, which was maintained for 20 to 40 seconds.

Since ILD films spun from xylene solvents (as mentioned, for example, in U.S. Pat. No. 4,663,414 to W. E. Estes et al.) frequently have a rippled (or striated) surface, a number of solvents were used in an attempt to reduce or even eliminate such striations without sacrifice in either the reflectivity of the films or of the desired clearness of the solutions.

The standard conditions used for comparison of the film qualities were: 150 grams of solvent; 60 grams of phenyl siloxane material (SY430 brand); 10 grams of tetraethylorthosilicate; spin speed of 2000 rpm; followed by heat curing at 350° C. in an INTEX furnace for 20 minutes. The siloxane/silicate composition is described in U.S. Pat. No. 4,801,507.

The following description sets forth the tabulation of solvent used and observations on the type of film produced:

| Solvent Used | Observations |
| --- | --- |
| Toluene | Hazy film, striated surface |
| Xylene | Hazy film, striated surface |
| Ethylene glycol | Poor film, heavily striated surface |
| Methoxy ethanol | Slightly hazy film |
| Ethoxy ethanol | Slightly hazy film |
| Butoxy ethanol | Hazy film |
| 1-Methoxy-2-propanol | Good film. Highly reflective and |

| Solvent Used | Observations |
| --- | --- |
| | planar. About 1.8 microns thick |

EXAMPLE 2

A solution containing 150 gm of 1-methoxy-2-propanol, 60 gm of phenyl silicone resin (SY430), and 10 gm of tetraethylsilicate (TEOS) was prepared The clear solution had a solids content of 28.5 wt% and could be spun on silicon wafers followed by treatment in an INTEX belt furnace. The solution could be further diluted with the propanol to yield lower solids containing systems which result in thinner films being formed at the same spin speed. Faster spinning speeds generally result in thinner films although a minimum value will generally be achieved. The Table, below, summarizes a variety of film thickness results as a function of varying the solids content and spinning speed:

| % Solids | Seed (rpm) | Thickness (Angstroms) |
| --- | --- | --- |
| 28.5 | 1000 | 24800 |
| 20 | 1500 | 5940 |
| 15 | 1500 | 3900 |
| 10 | 1500 | 2550 |
| 5 | 1500 | 1100 |
| 15 | 1000 | 6490 |
| 15 | 2000 | 4225 |
| 15 | 3000 | 3025 |
| 15 | 4000 | 2400 |
| 15 | 5000 | 2425 |

EXAMPLE 3

A solution containing 1200 gm of 1-methoxy-2-propanol, 760 gm of silicon resin (SY430), and 80 gm of TEOS was prepared. The clear solution had a solids content of 38.5%. Silicon wafers were coated at 5000 rpm to yield films having a wet thickness of 41,700 Angstroms. Polyimide (KAPTON brand) substrates were spin coated at speeds of 3000 and 5000 rpm, followed by INTEX oven treatment at 270° C. The film thicknesses obtained in this manner were 20,000 and 17,000 Angstroms, respectively.

EXAMPLE 4

A solution containing 150 gm of 1-methoxy-2-propanol, 60 gm of silicone resin (SY430), and 9 gm of triethoxyvinylsilane was prepared. The clear solution had a solids content of 28 wt%. The solution could be diluted with further addition of 1-methoxy-2-propanol Films spun onto silicon wafers could be cured thermally using an INTEX furnace at 350° C. or photocured using broad band ultraviolet radiation. Films spun at 2000 rpm from solution containing 28 wt%, 20 wt% and 10 wt% solids yielded films having a thickness of 13,300, 7,100 and 4,800 Angstroms, respectively.

EXAMPLE 5

The solution from Example 3 was used to spin coat polyetheretherketone (PEEK)/graphite composites. The films were thermally cured at 270° C. in an INTEX oven. The Table shows the results of film thickness as a function of spinning speed:

| Speed (rpm) | Thickness (Angstroms) |
| --- | --- |
| 1000 | 30,600 |
| 2000 | 22,700 |
| 3000 | 18,900 |
| 5000 | 16,200 |

All of the films passed the adhesion test described in ASTM D3359.

PEEK substrates were also coated by immersion in the 38.5 wt% solids solution for thirty seconds followed by rapid withdrawal. The films were allowed to dry at 150° C. for about two hours Films with thicknesses of about 20 microns were obtained.

The solution from Example 3 can also be used to dip coat alumina wafers. At about 40 wt% solids, coatings of about 12 microns were obtained when air dried at 275° C. for up to twenty hours When the solution was diluted to 10 wt% solids, coatings of about 2 microns in thickness were obtained after similar treatments as described above. The Shore D hardness data (1 kg) of these films is tabulanzed below:

| Wt % Solids | Initial | 10 Seconds |
| --- | --- | --- |
| 10 | 90 | 50 |
| 40 | 90 | 55–60 |

The foregoing is intended to illustrate certain preferred embodiments of the present invention and should not be construed in a limiting sense. The scope of protection that is sought is set forth in the claims which follow.

We claim:

1. A homogeneous liquid composition which comprises an alkoxy alkanol solvent containing a photocurable arylsiloxane oligomer or polymer dissolved therein.

2. A method of forming a coating on a substrate which comprises coating the substrate with the composition of claim 1 and curing the composition.

3. A homogeneous liquid composition which comprises an alkoxy alkanol solvent containing a photocurable arylsiloxane oligomer or polymer, which is a phospho-boro-silanol material, dissolved therein.

4. A homogeneous liquid composition which comprises an alkoxy alkanol solvent containing a photocurable arylsiloxane oligomer or polymer, which is formed by cohydrolyzation and cocondensation of a silanetriol with a tetrafunctional silicic acid compound, dissolved therein.

5. A composition as claimed in claim 4 wherein the silanetriol is phenyl silanetriol and the silicic acid compound is a tetraalkyl silicate.

6. A composition as claimed in claim 4 wherein the tetraalkyl silicate is tetraethyl silicate.

7. A homogeneous liquid composition which comprises an alkoxy alkanol solvent containing a photocurable arylsiloxane oligomer or polymer dissolved therein, wherein the alkoxy alkanol has the formula R'OROH where R' is $C_1$-$C_4$ alkyl and R is $C_2$-$C_3$ alkylene, and the photocurable arylsiloxane oligomer or polymer is formed by cohydrolyzation and cocondensation of a silanetriol with a tetraalkyl silicate, wherein the arylsiloxane content is from about 5% to about 40%, by weight of the entire composition.

8. A composition as claimed in claim 7 wherein the alkoxy alkanol is methoxy propanol and the tetraalkyl silicate is tetraethyl silicate.

9. A method of forming a coating on a substrate which comprises coating the substrate with any one of the compositions of claims 5, 6, 8, 3, 4 or 7 and curing the composition.

* * * * *